March 17, 1959 W. A. GAMMEL 2,877,544

METHOD OF LOCATING AND REPLACING DEFECTIVE COMPONENTS OF ENCAPSULATED ELECTRICAL ASSEMBLIES

Filed Aug. 30, 1954

INVENTOR
W. A. GAMMEL
BY C. B. Hamilton
ATTORNEY

United States Patent Office 2,877,544

Patented Mar. 17, 1959

2,877,544

METHOD OF LOCATING AND REPLACING DEFECTIVE COMPONENTS OF ENCAPSULATED ELECTRICAL ASSEMBLIES

Walter A. Gammel, Roseville, Minn., assignor to Western Electric Company, Incorporated, New York, N. Y., a corporation of New York Application August 30, 1954, Serial No. 453,072

2 Claims. (Cl. 29—401)

This invention relates to encapsulated electrical devices, such as networks, filters, etc., having the components thereof imbedded and enclosed in molded plastic castings, and more particularly to a method of locating and replacing defective components in such encapsulated electrical devices and recasting the plastic casings to seal in the replaced components.

An object of the present invention is to provide a method of locating defective components of an encapsulated electrical device.

Another object of the invention is to provide a method of removing and replacing located defective components of an encapsulated composite electrical device and encapsulating the replaced components.

A method illustrating certain features of the invention for replacing a defective component of an encapsulated composite electrical device may include making a template with apertures therein indicating the position of the components of the electrical device, connecting external terminals of the device to test sets to test the components which are connected in groups or branch circuits to external terminals to determine in which branch circuit the defective component occurs, placing the template in a predetermined position on the device to locate the position of the group of components which contains the defective one, cutting away some of the resin encapsulating material adjacent to the selected group of components to expose the terminals thereof, disconnecting one or both terminals of each of the uncovered components and testing them individually to determine which one is defective, removing the defective component and replacing it with a non-defective one, and placing the device in a mold and molding in the missing portions of the encapsulating material to seal in the replaced component.

Other objects and advantages of the invention will become apparent by reference to the following detailed description thereof and the accompanying drawings illustrating a preferred embodiment, in which—

Figures 1, 2, 3, 4:
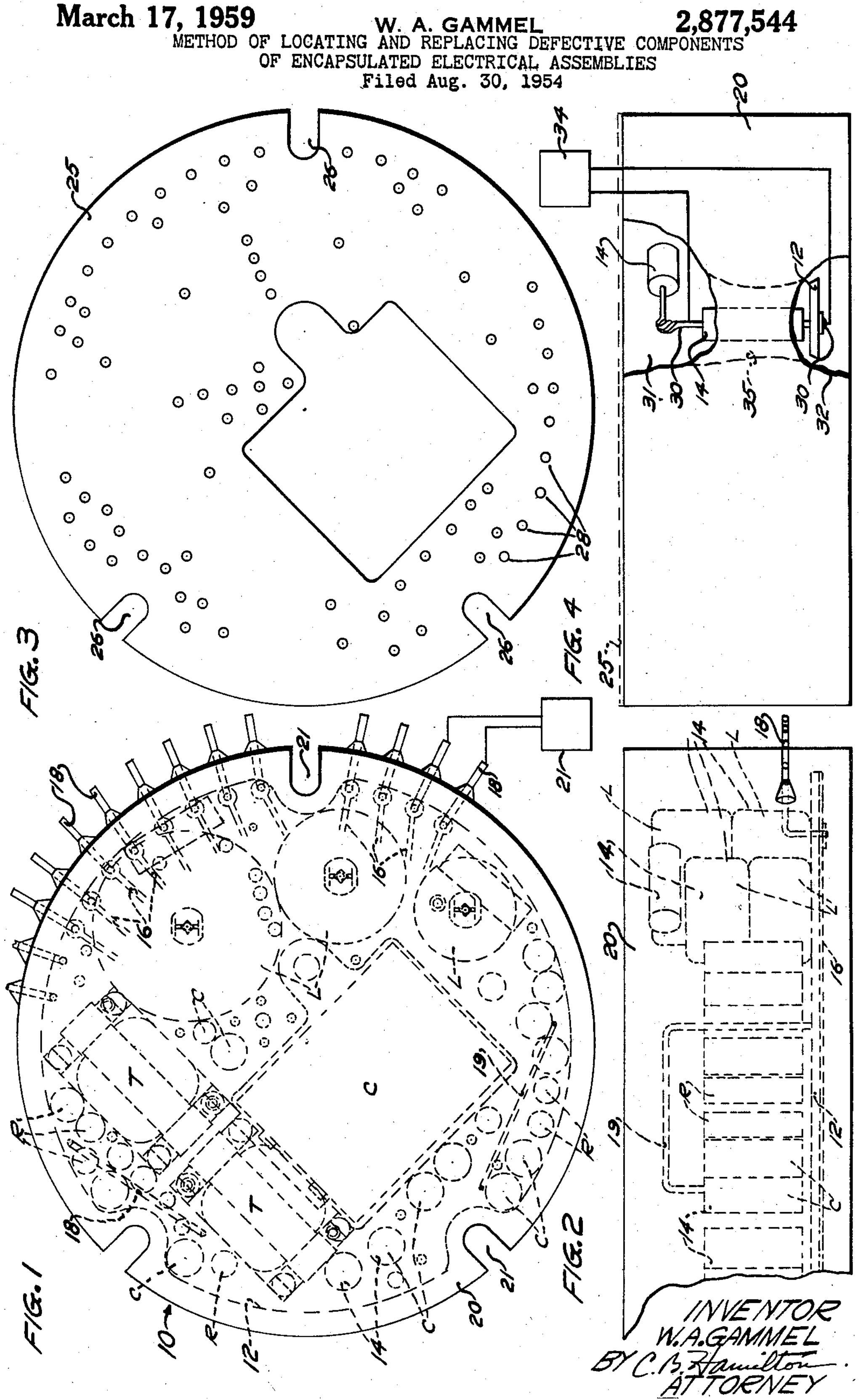
Fig. 1 is a plan view of an electrical unit of encapsulated electrical components showing the external terminals of some of the components connected to an electrical test set.
Fig. 2 is a fragmentary side elevational view of the unit.

Fig. 3 is a plan view of a template with perforations therein arranged according to the position of the components in said electrical unit; and Fig. 4 is a side elevational view of the electrical unit showing a template thereon in dotted lines and showing portions of the encapsulating material cut away to expose portions of a group of components and showing an electrical test set connected to one of them.

The present method was developed to accomplish the locating, removal, and replacement of defective components of encapsulated electrical devices of various kinds. An example of such an encapsulated electrical assembly 10, as shown in the drawings, comprises a mounting plate 12 of fiber or other insulating material for supporting the electrical components 14 thereon which include transformers T, capacitors C, inductance coils L, and resistors R, arranged in a predetermined pattern as indicated in Fig. 1. The mounting plate 12 has a plurality of apertures and hollow terminals and some of the terminals and leads of the various components pass through the apertures in the mounting plate and are electrically connected to these hollow terminals and to a plurality of flat conductor strips 16 secured to the underside of the mounting plate 12 in spaced relation to each other which connect the components 14 in branch circuits in groups to various ones of a plurality of external terminals 18 having portions extending radially outwardly from the electrical device 10. Other leads from the electrical components 14 are connected to other components 14 and to wire conductors 19 which extend upwardly from and are supported by the mounting plate 12 and are electrically connected to some of the flat conductor strips 16. The mounting plate 12, with the various components 14 and terminals 18 thereon is then encapsulated in an electrically insulating plastic molding material, such as a polyester or epoxy type casting resin, by placing the assembly in a mold and molding the material therearound to form a casing 20 of plastic material supporting and sealing the components 14 and interconnecting conductors. The casing 20 is provided with a plurality of slots 21 for receiving bolts therein for securing the device 10 in a desired location.

After molding, the encapsulated electrical device 10 is tested by connecting predetermined groups of the terminals 18 to various test sets, one of which is indicated at 21 in Fig. 1, to check the electrical values thereof and determine whether any of the components in various branch circuits of the device are defective. In order to aid in determining the location of a defective component, a flat template 25 is made having radial slots 26 corresponding to the slots 21 in the device 10 and having a plurality of apertures 28 corresponding to the position of the apertures in mounting plate 12 and terminals or leads of the various components 14 mounted on the mounting plate 12.

When the tests show that the electrical values of a branch circuit differ from the proper values and that a component 14 of the branch is defective, the template 25 is placed on the device 10 with the slots 26 aligned with the slots 21 and with the apertures therein in aligned relation to the components 14 of the device and the position of the group of components in the branch including the defective component may be determined therefrom and indicated on the device by marking, if desired, or by drilling one or more holes through the aperture of the template into the casing 20 toward the conductor leads or terminals 30 of one or more of the components, and the material adjacent the end of the selected components may be drilled, chipped, or otherwise cut away, as shown at 31, Fig. 4, to expose the ends of one or more of the components and the electrical leads therefrom. The opposite ends of the component are exposed in like manner, as shown at 32, to have the other leads 30 available. The leads 30 of the selected individual component 14 are connected directly to a test set 34 (Fig. 4) and the component is tested to determine whether it is defective.

When the defective component has been identified, sufficient of the plastic encapsulating material adjacent the component is cut away, as shown in dotted lines at 35, to permit the removal of the defective component, after which a new component is reinserted in the device and the leads thereof electrically reconnected into their proper position in the branch circuit. The branch circuits may then be retested to determine whether they are satisfactory, and if all defective components have been removed and the device 10 is satisfactory, it is vacuum dried, placed in a mold (not shown) and plastic material molded into those portions of the device which had been previously cut away to fill in the missing portions thereof and complete the encapsulating casing around the components.

It will be understood that the defective component may be located in various positions of the device 10 such as on the upper, bottom, or side portions of the device and may be of different sizes and that when it has been found and its position has been determined, it may be necessary only to cut away the encapsulating material on one face of the casing 20 in order to uncover the defective component, remove it, and replace it with a good one.

It is to be understood that the above-described arrangements are simply illustrative of the application of the principles of the invention. Numerous other arrangements may be readily devised by those skilled in the art which will embody the principles of the invention and fall within the spirit and scope thereof.

What is claimed is:

1. A method of locating and replacing defective components of a composite electrical device encapsulated in a block of opaque dielectric material and with the components disposed in predetermined positions relative to each other in the block and electrically connected in branches to predetermined external terminals, which comprises forming a template with apertures therein arranged to indicate the precise position of each of the components of said electrical device and the leads thereof, electrically testing successive branches to determine which one is defective, placing the template on the block of encapsulating material in a predetermined relation to the external terminals thereon, marking through the template onto the block of encapsulating material the position of the leads of the components in the defective branch, cutting away some of the encapsulating material to obtain access to the leads of the components in the defective branch, electrically testing successive components in the defective branch to locate the defective one, cutting away sufficient encapsulating material to permit removal of the defective component, removing the defective component and replacing it with a good one, and molding dielectric material around the replaced component to seal it in the encapsulating block.

2. A method of locating and replacing defective components of a composite electrical device encapsulated in a block of opaque dielectric material and with the components disposed in predetermined positions relative to each other in the block and electrically connected in branches to predetermine external terminals, which comprises forming a template with apertures therein arranged to indicate the precise position of each of the components of said electrical device and the leads thereof, electrically testing successive branches to determine which one is defective, placing the template on the block of encapsulating material in a predetermined relation to the external terminals thereon, marking through the template onto the block of encapsulating material the position of the leads of the components in the defective branch, cutting away some of the encapsulating material to obtain access to the leads of the components in the defective branch, electrically testing successive components in the defective branch to locate the defective one, cutting away sufficient encapsulating material to permit removal of the defective component, removing the defective component and replacing it with a good one, vacuum drying the composite electrical device, and molding dielectric material around the replaced component to seal it in the encapsulating block.

References Cited in the file of this patent

UNITED STATES PATENTS

| | | |
|---|---|---|
| 219,860 | Healey | Sept. 23, 1879 |
| 1,059,124 | Doxford | Apr. 15, 1913 |
| 1,710,744 | Roe | Apr. 30, 1929 |
| 1,758,235 | Nash | May 13, 1930 |
| 2,276,571 | Grypma | Mar. 17, 1942 |
| 2,418,007 | Barnes | Mar. 25, 1947 |
| 2,563,829 | Fitzgerald | Aug. 14, 1951 |
| 2,590,821 | Kiser | Mar. 25, 1952 |
| 2,642,481 | Wilson | June 16, 1953 |
| 2,683,766 | Cunningham | July 13, 1954 |